United States Patent [19]

Onaya et al.

[11] Patent Number: 5,500,825

[45] Date of Patent: Mar. 19, 1996

[54] PARALLEL DATA OUTPUTTING STORAGE CIRCUIT

[75] Inventors: Masato Onaya; Susumu Yamada, both of Ora, Japan

[73] Assignee: Sanyo Electric Co., Ltd., Osaka, Japan

[21] Appl. No.: 268,165

[22] Filed: Jun. 28, 1994

[30]  Foreign Application Priority Data

Jun. 30, 1993  [JP]  Japan .................................. 5-189094

[51] Int. Cl.⁶ ..................................................... G11C 7/00
[52] U.S. Cl. ......................... 365/219; 365/220; 365/221; 365/236; 365/239
[58] Field of Search ..................................... 365/219, 220, 365/221, 236, 194, 239, 233; 381/63; 84/629, 630

[56]  References Cited

U.S. PATENT DOCUMENTS

| 4,171,538 | 10/1979 | Sheller ............................... 365/236 X |
| 4,237,343 | 12/1980 | Kurtin et al. ............................. 381/63 |
| 4,389,915 | 6/1983 | Bione ........................................ 381/63 |
| 4,549,283 | 10/1985 | McDermott ............................. 365/194 |
| 4,611,299 | 9/1986 | Hori et al. ............................... 365/189 |
| 4,710,966 | 12/1987 | Aufiero ................................. 365/220 X |
| 4,873,667 | 10/1989 | Geadah et al. ....................... 365/221 X |
| 4,945,518 | 7/1990 | Muramatsu et al. ..................... 365/233 |
| 5,280,448 | 1/1994 | Watanabe ....................... 365/230.06 X |

FOREIGN PATENT DOCUMENTS 0561306  9/1993  European Pat. Off. .

*Primary Examiner*—David C. Nelms
*Assistant Examiner*—Son Dinh
*Attorney, Agent, or Firm*—Loeb and Loeb

[57]  ABSTRACT

A plurality of delay time data can easily be obtained. A data input unit 32 successively writes data into a memory 30. A data output unit 36 outputs data from six areas a-f in the memory 30 in the parallel manner. Selection units SW1 and SW2 successively select and output data read out from the six areas a-f in the memory 30. Locations to be read are shifted from one another by the selection units SW1 and SW2 to output data from different memory locations. Thus, a plurality of data which are different in time between write and readout operations (i.e., different delay times) can be obtained simultaneously.

8 Claims, 2 Drawing Sheets

PARALLEL DATA OUTPUTTING STORAGE CIRCUIT

BACKGROUND OF THE INVENTION

1. Field of the Invention

The present invention relates to a storage circuit usable in a delay circuit which may be used to generate surround-sounds in an audio instrument.

2. Description of the Prior Art

Conventional audio instruments generate surround-sounds by attenuating and superimposing reproduced sounds with a time delay. Reproduce modes include stadium mode, church mode and other modes in which reproduced sounds are superimposed on top of one another with a time delay through different techniques.

A delay circuit used for such applications is exemplified in FIG. 1. The delay circuit includes an A/D converter 10 for temporarily converting analog reproduction signals into digital data which are in turn stored in a memory 12. The delay circuit also includes a D/A converter 14 for converting the digital data read out from the memory 12 back into analog data. If there is a difference between write time and read time in the memory 12, it will be a delay time.

More particularly, a delay time signal can be obtained by writing data into the memory 12 at an address and reading out data from the memory 12 at another address spaced away from the first-mentioned address by a given time period (i.e., a location at which the other data has been written before the given time period).

In the church mode, for example, reproduced sounds are required to provide many echoes as in an actual church. Thus, a great number of reproduction signals must be generated with a plurality of short delay times to attenuate and superimpose each set of reproduction signals one on top of another.

In order to provide four different types of delay time data, for example, data will be readout at four different addresses (READs 1–4) before a data writing cycle is repeated while sequentially changing the address, as shown in FIG. 2.

However, such a process must do four read addressings and one write addressing through one cycle. If the input data clock is sufficiently slow, the five addressings do not raise any problem. However, the A/D converter 10 used in the delay circuit of FIG. 1 has a very fast clock since it functions to output signals in the form of a pulse string through the conventional over-sampling action. When five addressings are to be carried out within one cycle, it will exceed the capacity of the memory cell.

SUMMARY OF THE INVENTION

It is therefore an object of the present invention to provide a storage circuit which can obtain a plurality of delay time data simultaneously through one read-out.

The present invention relates to a storage circuit comprising a memory for storing data, write means for sequentially writing input data into the memory in the order of address, read means for dividing the memory into a plurality of groups and for sequentially reading the data from the memory groups in the order of address to output the data stored in locations spaced away from one another in the parallel manner, first selection means for receiving a plurality of outputs from the read means and for selecting and sequentially outputting said outputs and second selection means for receiving a plurality of outputs from the read means and for sequentially selecting and outputting the outputs belonging to a group different from that of the first selection means, whereby the outputs of the first and second selection means can provide different delay time data.

Thus, the write means sequentially writes the data into the memory as in the prior art while the read means simultaneously reads out the data from the memory at a plurality of locations. The selection means sequentially selects data among the read data that are spaced away from the write locations by a given address. Thus, a given delay time data can be obtained. By using a plurality of selection means to obtain data from different groups, different delay time data can be simultaneously obtained through one readout.

Therefore, a plurality of delay time data can easily be obtained independently of rapid clock input signals.

The write means includes a write address counter for counting clocks in synchronism with the timing of input data. The write means is adapted to write input data into the memory at addresses corresponding to the count-up values of the write address counter.

The read means includes a plurality of data buses for separately outputting the read data from the respective groups. Thus, the data can be read out from the memory groups in the parallel manner.

The read addresses in the memory are common to the respective groups. Therefore, only one read addressing is required to output the data from the respective memory groups in the parallel manner.

The read means sequentially counts up the read address counter so that the data will be sequentially read out from the respective memory groups.

DETAILED DESCRIPTION OF THE EMBODIMENT

The present invention will now be described by way of example with reference to the drawings.

Figure 1:
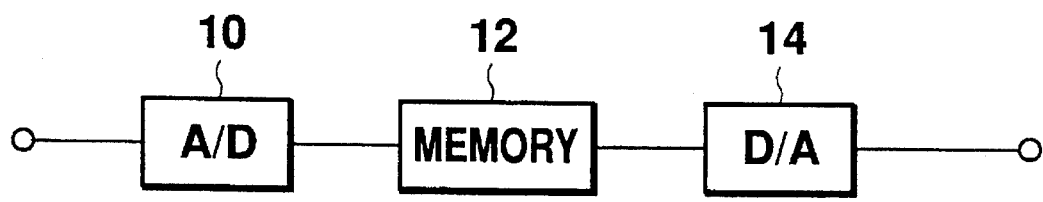
FIG. 1 is a block diagram of the entire layout of a delay circuit according to the prior art.
Figure 2:
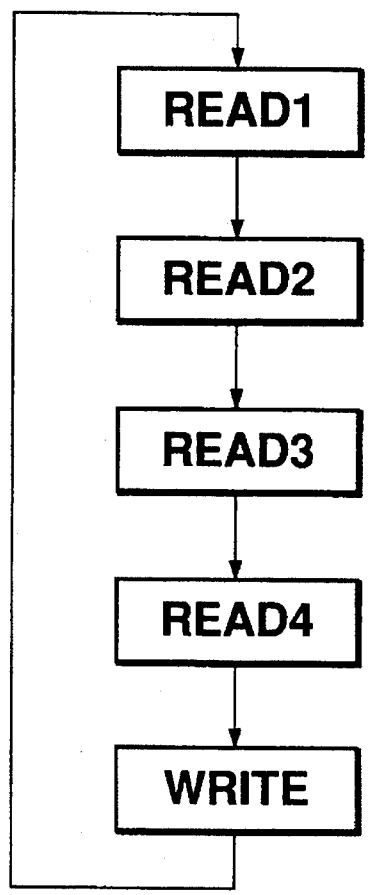
FIG. 2 is a view illustrating the write and read operations in the prior art.
Figure 3:
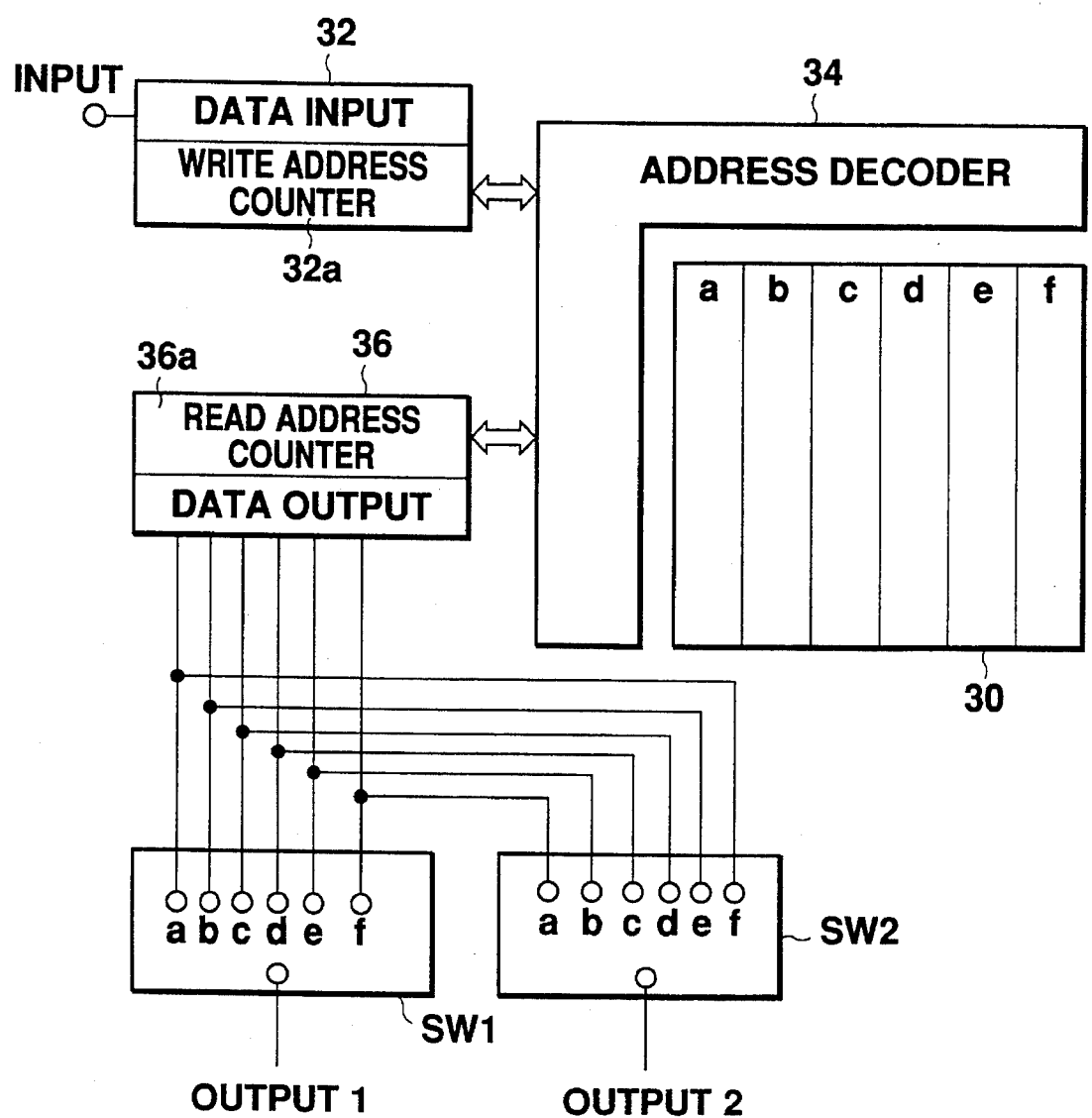
FIG. 3 is a block diagram of the entire layout of a storage circuit constructed in accordance with the present invention.

FIG. 3 is a block diagram of the entire layout of a storage circuit constructed in accordance with the present invention. The storage circuit comprises a memory 30 for storing data, which may be DRAM. The storage circuit also comprises a data input unit 32 for writing digital input data into the memory 30 at given addresses. The data input unit 32 includes a write address counter 32a for determining write addresses. The value of the write address counter 32a is supplied to an address decoder 34 through an address bus. By setting the input data at a data bus, the input data is written into the memory 30 at an associated address. When the write address counter 32a is formed to have a capacity corresponding to the capacity of the memory 30 and counted up with a clock synchronized with the input data, the input data are successively written into the memory 30.

The storage circuit further comprises a data output unit 36 for outputting data stored in the memory 30 at given addresses. The data output unit 36 includes a read address counter 36a for specifying readout addresses. Data at addresses specified by the read address counter 36a of the memory 30 are read out and outputted through the data output unit 36.

In this embodiment, the values of the read address counter 36a are used to output the data from a plurality of addresses in the parallel manner. More particularly, the memory 30 is divided into six areas a–f, each of which is responsive to the output of the read address counter 36a to output the data therefrom. When the values of the read address counter 36a are decoded by the address decoder 34, all the six addresses must simultaneously be specified. On readout, the addresses of the areas a–f in the memory 30 are common to one another. To enable the parallel output, six data buses are disposed in parallel. Since the data is one bit, each data bus is one bit.

The data buses for outputting read data are inputted into selection units SW1 and SW2, respectively. Each of the selection units SW1 and SW2 has six input terminals for receiving the respective outputs from the areas a–f in the memory 30. Data at one input terminal is selected and outputted. This selection is carried out in order such that the output of the area b will be performed after the output of the area a has been terminated. The selection units SW1 and SW2 are set to select different areas in the memory 30 at all times.

For example, when data are successively written into the respective areas in the order of f→a→b→c→d→e→f as designated by write address counter 32a. On the other hand, the data read out from the memory 30 are outputted from the respective areas a–f in the parallel manner as designated by read address counter 36a. More particularly, at the next timing after data has been written into the memory at an address f0, data at addresses a0, b0, c0, d0, e0 and f0 appear at the respective input terminals in the selection units SW1 and SW2. Such a cycle is sequentially repeated.

For example, the selection unit SW1 may select data in the order of d→e→f→a→b→c→d while the selection unit SW2 may select data in the order of b→c→d→e→f→a→b.

Thus, the output of the selection unit SW1 is data spaced away from the write address by two areas in the memory 30, that is, data which is previous by a time period corresponding to the two areas. The output of the selection unit SW2 is data spaced away from the write address by four areas in the memory 30. Thus, different delay time data will appear simultaneously at the output terminals of the selection units SW1 and SW2. Such a simultaneous readout operation responds to only one write operation.

If the number of divided areas in the memory 30 is increased and the corresponding number of selection units SW are provided, the corresponding number of different delay time data can be obtained. The selection units SW can easily be formed of transistors.

The utilization of such a storage circuit can easily provide a plurality of delay time data. For example. the storage circuit may easily be used to provide surround-sounds in the church mode.

We claim:

1. A storage circuit usable in a delay circuit, comprising:
   a memory for storing data,
   write means for sequentially writing input data into the memory in an order of address,
   read means for dividing the memory into a plurality of groups and for reading the data from the respective memory groups to output the data stored in locations spaced away from one another in a parallel manner,
   first selection means for receiving a plurality of outputs from the read means, selecting a data element associated with a first one of the memory groups from one of the plurality of outputs from the read means, providing the selected data element to an output terminal of the first selection means, and sequentially changing the output of the read means from which a next data element is selected; and
   second selection means for receiving a plurality of outputs from the read means, selecting a data element associated with a second one of the memory groups from one of the plurality of outputs from the read means, providing the selected data element to an output terminal of the second selection means, and sequentially changing the output of the read means from which a next data element is selected.

2. A storage circuit as defined in claim 1 wherein said write means includes a write address counter for counting clocks in synchronism with the timing of input data and functions to write input data into the memory at addresses corresponding to the count-up values of the write address counter.

3. A storage circuit as defined in claim 2 wherein the read means includes a plurality of data buses for separately outputting the read data from the respective groups.

4. A storage circuit as defined in claim 3 wherein a read address in the memory is common to the respective groups whereby only a single read addressing operation is required to output the data from the respective memory groups in a parallel manner.

5. A storage circuit as defined in claim 4 wherein the read means sequentially reads out the data from respective memory groups by the read address counter being sequentially counted up.

6. A storage circuit as defined in claim 1, wherein said read means reads data from said memory according to said order of address.

7. A storage circuit as defined in claim 1, wherein when said first selection means sequentially changes the output of the read means from which the next data element is selected, said first selection means selects data from the memory group next in the order of address to said first one of the memory groups, and when said second selection means sequentially changes the output of the read means from which the next data element is selected, said second selection means selects data from the memory group next in the address order to said second one of the memory groups.

8. A storage circuit, comprising:
   a memory having a plurality of memory groups for storing data, each of said plurality of memory groups having a write address with an associated value, the write addresses of said plurality of memory groups forming an ordered set;
   write counter means for generating a sequence of said write addresses;
   write means for sequentially writing data elements into said memory groups;
   read means for reading said data elements from said memory groups and outputting said data elements in a parallel manner so as to provide a plurality of read means data outputs, wherein each of said data elements is associated with one of said plurality of said read means data outputs;
   first selection means for receiving said plurality of read means data outputs, selecting a data element associated with a write address having a first associated value lower than the associated value of a write address to which said write means is currently writing data, outputting said data element at a first selection means output terminal, and sequentially changing the output of the read means from which a next data element is selected; and, second selection means for receiving said plurality of read means data outputs, selecting a data element associated with a write address having a second associated value different from said first associated value and lower than the associated value of a write address to which said write means is currently writing data, outputting said data element at a second selection means output terminal, and sequentially changing the output of the read means from which a next data element is selected.

* * * * *